(12) United States Patent
Kawano et al.

(10) Patent No.: US 6,745,093 B1
(45) Date of Patent: Jun. 1, 2004

(54) VACUUM PROCESS APPARATUS AND METHOD OF OPERATING THE SAME

(75) Inventors: Tomoyuki Kawano, Yamaguchi (JP); Kouji Nishihata, Tokuyama (JP); Tetsuya Tahara, Hikari (JP); Shoji Okiguchi, Kudamatsu (JP); Hideki Yamasaki, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/526,206

(22) Filed: Mar. 15, 2000

(30) Foreign Application Priority Data

Mar. 17, 1999 (JP) .......................................... 11-072578

(51) Int. Cl.$^7$ .............................................. G06F 19/00
(52) U.S. Cl. ...................................... 700/121; 700/112
(58) Field of Search ........................... 700/97, 100, 101, 700/112, 121

(56) References Cited

U.S. PATENT DOCUMENTS

| 5,801,945 | A | * | 9/1998 | Comer | 700/100 |
|---|---|---|---|---|---|
| 5,928,389 | A | * | 7/1999 | Jevtic | 29/25.01 |
| 6,122,566 | A | * | 9/2000 | Nguyen et al. | 700/218 |
| 6,134,482 | A | * | 10/2000 | Iwasaki | 700/121 |
| 6,274,507 | B1 | * | 8/2001 | Narita et al. | 438/758 |
| 6,340,405 | B2 | * | 1/2002 | Park | 156/345.32 |
| 6,353,769 | B1 | * | 3/2002 | Lin | 700/101 |
| 6,480,756 | B1 | * | 11/2002 | Luh et al. | 700/108 |

\* cited by examiner

*Primary Examiner*—Leo Picard
*Assistant Examiner*—Chad Rapp
(74) *Attorney, Agent, or Firm*—Antonelli, Terry, Stout & Kraus, LLP (57) ABSTRACT

A vacuum process apparatus has a plurality of cassettes for holding samples; a transporting means for transporting the samples; a plurality of vacuum process chambers each for processing samples one by one; an evacuation means for evacuating the vacuum process chambers; a load chamber and an unload chamber communicating with the vacuum process chambers; and an apparatus control means for controlling transporting and processing of the samples. The apparatus control means operates to measure a time period of transporting each of the samples and a time period of processing in each of the vacuum process chambers, and determines a next extracting order of extraction of the samples from the plurality of cassettes based on the measured time periods.

10 Claims, 9 Drawing Sheets

VACUUM PROCESS APPARATUS AND METHOD OF OPERATING THE SAME

BACKGROUND OF THE INVENTION

The present invention relates to a vacuum process apparatus comprising a control means for determining an order of loading samples of the vacuum process apparatus having a plurality of process chambers and a method of operating the vacuum process apparatus. More particularly, the invention relates to a vacuum process apparatus and a method of operating the vacuum process apparatus, which can improve the efficiency of processing samples in the operation of parallel processes using a plurality of process chambers.

A vacuum process apparatus having a control means for determining the order of loading samples into a plurality of process chambers is disclosed in Japanese Patent Application Laid-open No. 10-189687. This vacuum process apparatus has a system connecting a plurality of process chambers in which process scheduling is performed based on a priority order of the samples to be processed.

Further, a vacuum process apparatus for performing processing in parallel using a plurality of process chambers is disclosed in Japanese Patent Application Laid-open No. 63-133532. In a case where processing is performed in the vacuum process apparatus of a system connecting a plurality of process chambers to a transfer chamber in parallel, samples are loaded in the order of loading samples to the two process chambers so that the numbers of the samples from two sample cassettes become equal to each other.

In the case where processing is performed in a plurality of process chambers in parallel, since the processing time will not always be equal in all of the process chambers, even if samples are loaded in the order of loading samples to the two process chambers so that the numbers of the samples from two sample cassettes become equal to each other, there is a problem in that useless waiting time occurs in loading the samples into the process chambers.

SUMMARY OF THE INVENTION

An object of the present invention is to provide a vacuum process apparatus with the aim of improving the efficiency of sample processing in the overall vacuum process apparatus in operation of parallel processing using a plurality of process chambers and a method of operating the vacuum process apparatus.

In order to attain the foregoing object, the present invention is characterized by a vacuum process apparatus comprising a plurality of cassettes for containing samples; a transporting means for transporting said samples; a plurality of vacuum process chambers each for processing said samples one by one; an evacuation means for evacuating said vacuum process chambers; a load chamber and an unload chamber communicating with said vacuum process chambers; and an apparatus control means for controlling transporting and processing of said samples, wherein said apparatus control means measures a time period during which each of said samples is transported and a processing time period in each of said vacuum process chambers, and determines the next extracting order of said samples from said plurality of cassettes based on said measured time periods.

Another feature of the present invention involves provision of a vacuum process apparatus comprising a plurality of cassettes for containing samples; a transporting means for transporting said samples; a plurality of vacuum process chambers each for processing said samples one by one; an evacuation means for evacuating said vacuum process chambers; a load chamber and an unload chamber communicating with said vacuum process chambers; and an apparatus control means for controlling transporting and processing of said samples, wherein said apparatus control means calculates a required time until completion of preparation of the start of processing of a newly loaded sample using a time period of sample loading to and a time period of sample unloading from each of said vacuum process chambers, and a processing time period of each of the samples, and loads a sample from a cassette corresponding to a vacuum process chamber having the shortest required time among said vacuum process chambers to said vacuum process chamber.

Another feature of the present invention involves provision of a vacuum process apparatus comprising a plurality of cassettes for containing samples; a transporting means for transporting said samples; a plurality of vacuum process chambers each for processing said samples one by one; an evacuation means for evacuating said vacuum process chambers; a load chamber and an unload chamber communicating with said vacuum process chambers; and an apparatus control means for controlling transporting and processing of said samples, wherein said apparatus control means comprises:

a transporting and processing time measuring means for measuring and calculating a time period of sample loading to and a time period of sample unloading from each of said vacuum process chambers, and a sample processing time period in each of said vacuum process chambers;

a sample processing waiting time estimating means for calculating and estimating a required time until completion of preparation of the start of processing of a newly loaded sample using said time period of sample loading to and said time period of sample unloading from and said sample processing time period in each of said vacuum process chambers;

a sample processing order determining means having a function to determine a next extracting order of said samples based on data on said time period of sample loading to and said time period of sample unloading from and said waiting time period obtained; and a sample transporting and processing control means having a function to control the overall vacuum process apparatus so as to perform sample processing and sample transporting based on the result determined by said sample processing order determining means.

The vacuum process apparatus in accordance with the present invention selects a vacuum process chamber among the plurality of vacuum process chambers which has the shortest required time period from completion of sample processing under way now to completion of preparation to load a new sample. That is, in the vacuum process apparatus performing processing in parallel using a plurality of vacuum process chambers, in order to shorten the waiting time period until loading of a sample transported to the vacuum process apparatus into the vacuum process chamber, it is necessary to select a vacuum process chamber among the plurality of vacuum process chambers which has the shortest required time period from completion of sample processing under way now to completion of preparation to load a new sample.

According to the vacuum process apparatus in accordance with the present invention, the order of processing samples is determined by taking the waiting time period into consideration. Therefore, the sample processing efficiency can be improved because a vacuum process chamber series capable of fast processing can process second and third samples, while a process chamber series of slow processing is processing a first sample.

According to the vacuum process apparatus in accordance with the present invention, the waiting time period in the vacuum process apparatus can be minimized. Further, it is possible to shorten the time period from extracting a sample from a sample cassette and performing processing to returning the sample to the cassette.

Furthermore, since the time period for completing processing for each sample can be shortened, the processing time period for one sample cassette can be shortened.

Still further, by shortening the time period of processing for a first sample cassette, the timing to start processing of a second sample cassette can be made earlier. Therefore, there is an effect in that it is possible to improve the sample processing efficiency of the overall vacuum process apparatus per unit time.

DESCRIPTION OF THE PREFERRED EMBODIMENTS

Figure 1:
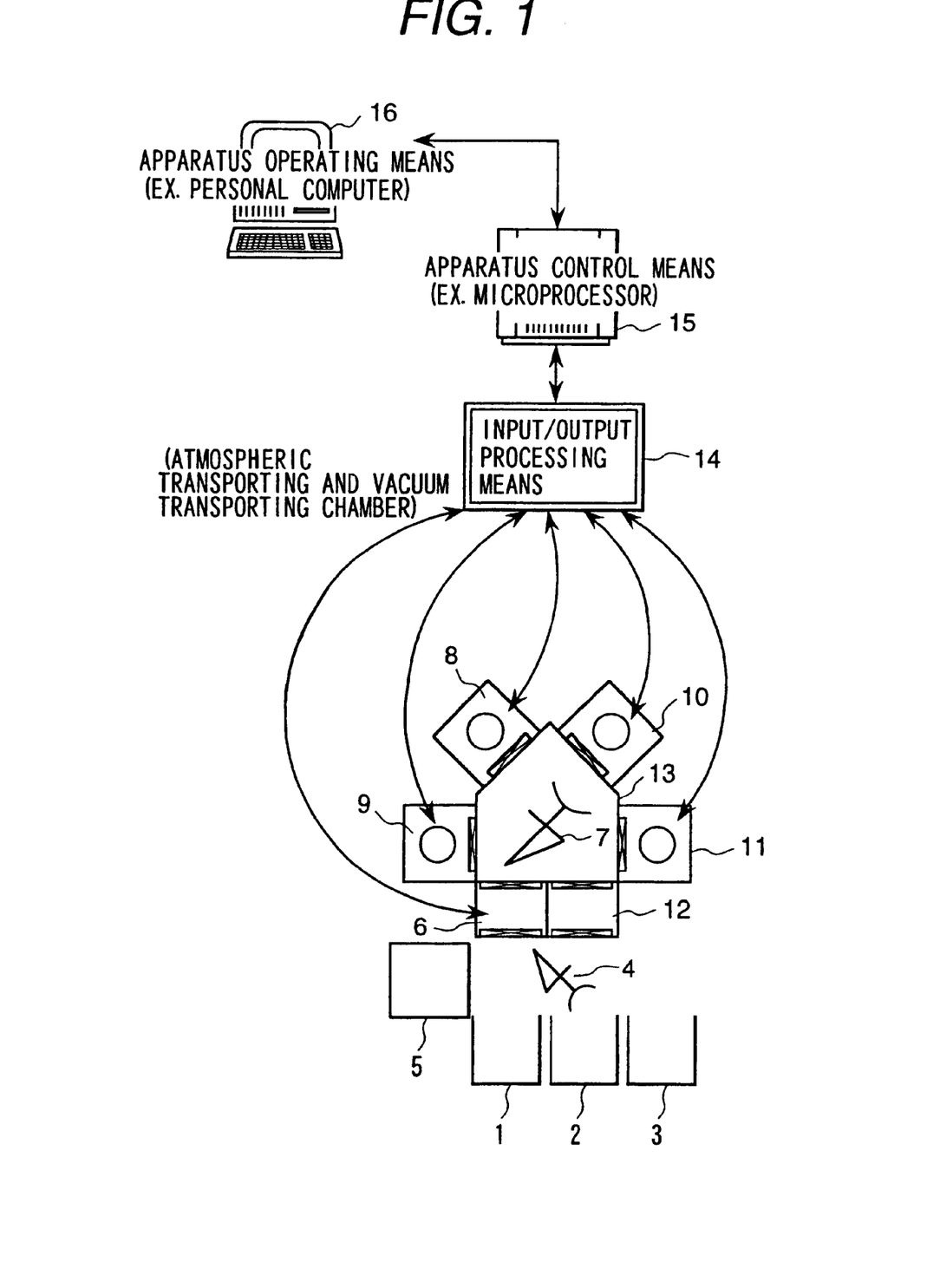
FIG. 1 is a diagram showing an example of the system structure of a vacuum process apparatus to which the present invention is applied.

An embodiment of the present invention will be described below with reference to the drawings. FIG. 1 shows an example of the system structure of a vacuum process apparatus to which the present invention is applied. The vacuum process apparatus of FIG. 1 comprises four process chambers 8 to 11, representing a first process chamber to a fourth process chamber, and three sample cassettes 1 to 3. A sample contained in the sample cassette 2 or the sample cassette 3 is extracted by an atmospheric transporting robot 4 and is transported to a load lock chamber 6 through an orientation flat adjusting unit 5. The load lock chamber 6 is capable of communicating with a vacuum transporting chamber 13 in a vacuum state by switching between the atmospheric state and a vacuum state. In the vacuum transporting chamber 13, a sample in the load lock chamber 6 is transported to any one of the process chambers 8 to 11 already in a vacuum state by a vacuum transporting robot 7.

The samples are processed in the process chambers 8 to 11, and, after completion of processing, the processed samples are transported to an unload lock chamber 12 by the vacuum transporting robot 7. Similar to the load lock chamber 6, the unload lock chamber 12 can be switched between the atmospheric state and the vacuum state. By switching the unload lock chamber 12 to the atmospheric state, the samples extracted from the unload lock chamber 12 by the atmospheric transporting robot 4 are returned to the sample cassettes 1 to 3.

The series of process described above is controlled by an apparatus control means 15 composed of a microcomputer through an input/output processing means 14. The apparatus control means 15 comprises a CPU, a memory such as a RAM, a ROM or the like, an external memory means, an input/output control means, an input/output means and so on. The apparatus control means controls operation of the vacuum process apparatus based on programs and commands pre-stored in the ROM and the like, various kinds of data stored in the memory, and information from various kinds of sensors and counters sensing the state of the vacuum process apparatus.

An operating procedure input means 16, such as a personal computer, is connected to the apparatus control means 15, and the programs and commands for executing various kinds of vacuum processing and various kinds of data are input to the apparatus control means 15, and recorded and stored in the memories such as the RAM, the ROM and the external memory unit.

Figure 2:
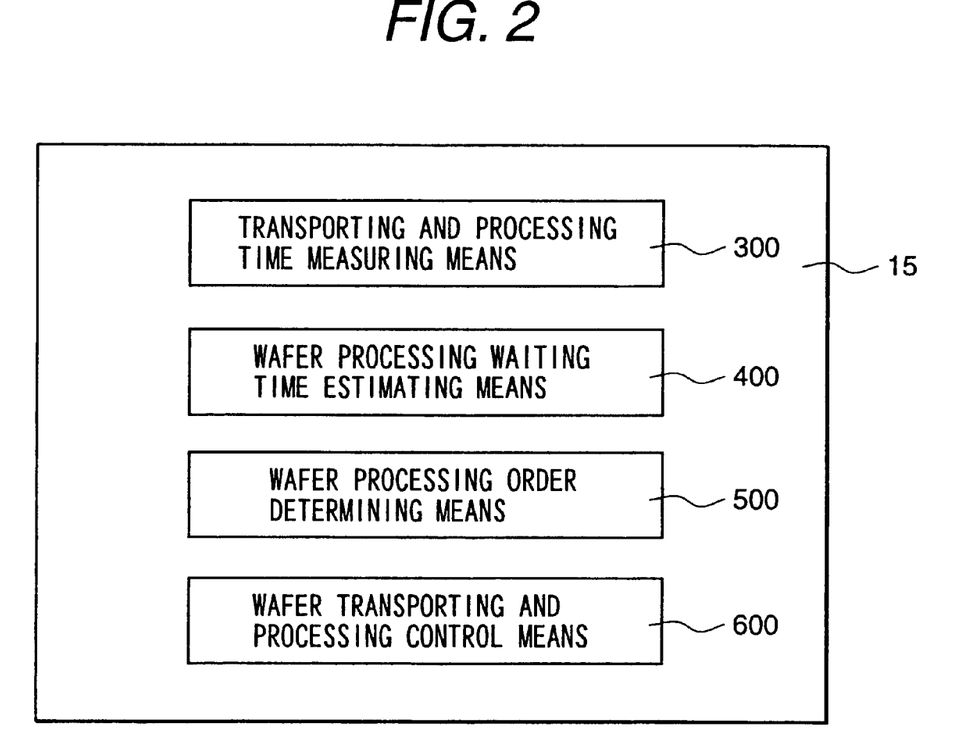
FIG. 2 is a diagram showing an example of a functional structure of the apparatus control means of FIG. 1.

FIG. 2 shows an example of the functional structure of the apparatus control means 15 described above. The apparatus control means 15 comprises a transporting and processing time measuring means 300 for calculating by measuring time periods of transporting a sample in the vacuum process apparatus and time periods of processing a sample in the process chamber, that is, a time period of sample loading to and a time period of sample unloading from each of the process chambers and a sample processing time period; a sample processing waiting time estimating means 400 for calculating and estimating a time period until completion of preparation to start processing of a newly loaded sample using the time period of sample loading and the time period of sample unloading and the sample processing time period described above; a sample processing order determining means 500 having a function to determine the next extracting order of the samples from the cassettes based on data indicating the transporting and the processing time periods and the waiting time period obtained above; and a sample transporting and processing control means 600 having a function to control the overall vacuum process apparatus so as to process and transport the samples based on the result determined by the sample processing order determining means 500.

The time period, from the time of loading a new sample until completion of loading the new sample into each of the process chambers, can be obtained by calculating a time period until the new sample is ready to be loaded into the process chamber, taking into consideration the remaining time period of sample processing under way now, the time period needed for unloading the processed sample, and the time period during which the processed sample must wait to be extracted due to the extraction of another sample to be transported, depending on the structure of the apparatus.

Figure 3A:
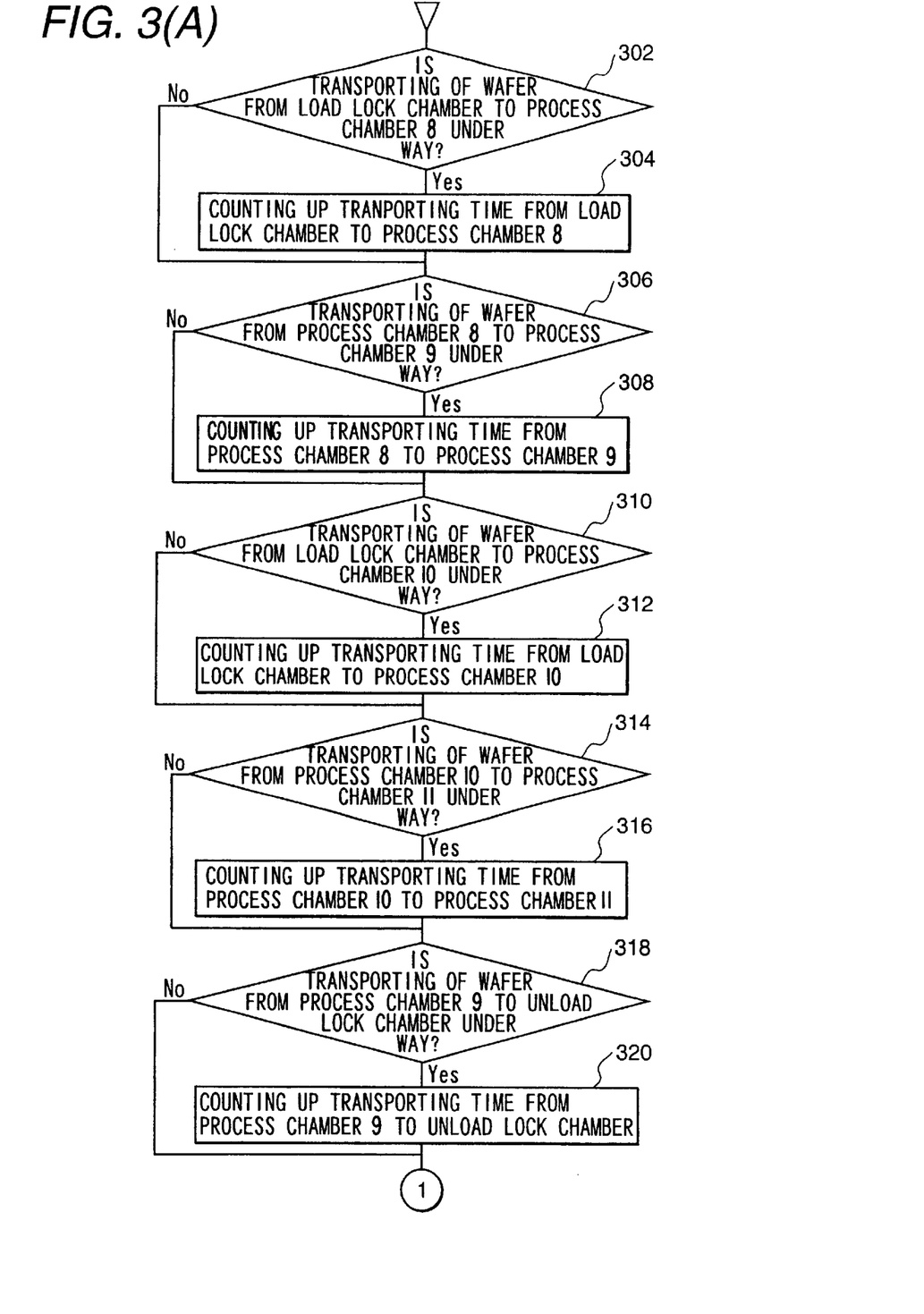
FIG. 3(A) and FIG. 3(B), when combined, provide a flowchart showing process operation of calculating sample processing and transporting time.
Figure 3B:
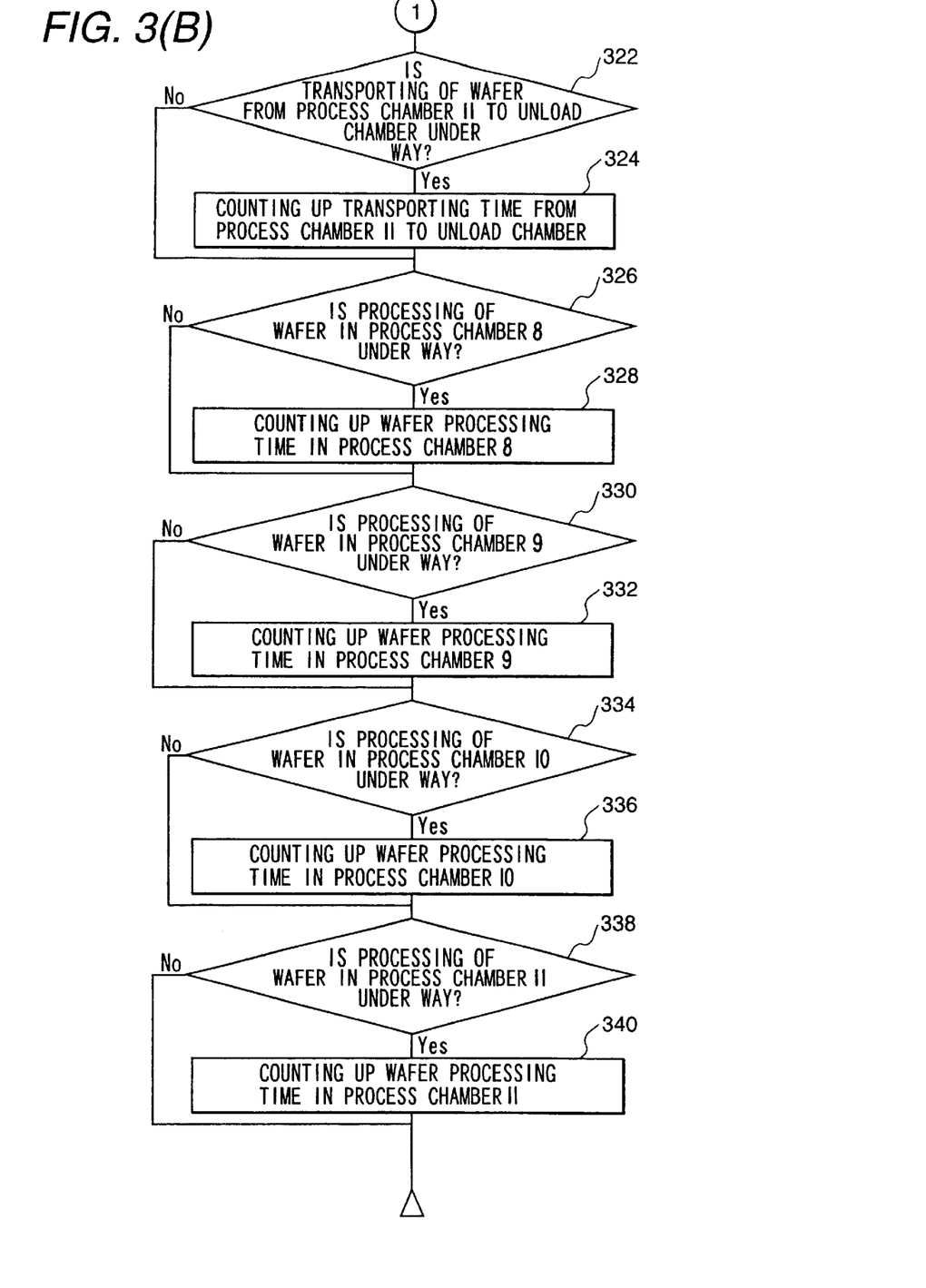

Procedures for loading and processing of samples in accordance with the present invention will be described below with reference to FIG. 3 to FIG. 5.

Initially, the transporting and processing time measuring means 300 will be described. It is assumed that the transporting and processing time measuring means 300 calculates in the case where sample processing is performed in the first process chamber 8 for the sample cassette 1 and the third process chamber 10 for the sample cassette in parallel. The time period until completion of preparation to the start of processing of a next sample in the first process chamber 8 is T1, and the time period until completion of preparation to the start of processing of a next sample in the third process chamber 10 is T2.

Letting the total time period needed for processing the sample under way in the process chamber 8 be Te1 and the elapsed time period of the processing in the process chamber 8 be Tz1, the remaining time period Tn1 of processing in the process chamber 8 can be calculated from the following equation.

$$Tn1 = Te1 - Tz1$$

Similarly, the remaining time period Tn2 of processing in the process chamber 9 can be calculated from the following equation.

$$Tn2 = Te2 - Tz2$$

The time period required for processing one sample in the process chamber can be obtained by measuring and storing a time period from the beginning to the completion of the sample processing previously executed. The time period required for processing the first sample can be obtained by referring to data on sample processing previously executed using another sample cassette. However, if there is no data on the measured processing time period because processing has never been executed before, the time period required for processing the first sample is obtained by performing a calculation taking time period data in processing data for performing sample processing into consideration.

The time period calculation described above will be described with reference to the flowchart of FIG. 3(A) and FIG. 3(B). The processing shown in this flowchart is a cyclic processing executed every 0.1 second and is used for required time calculation processing to judge the waiting time estimating processing described above by always measuring a time period of each transporting processing and a sample processing time period in each of the process chambers.

Initially, it is judged whether or not transporting of the sample from the load lock chamber 6 to the process chamber 8 is under way (Step 302). If the transporting of the sample from the load lock chamber 6 to the process chamber 8 is under way, the transporting time from the load lock chamber 6 to the process chamber 8 is counted (Step 304).

Next, it is judged whether or not transporting of a sample from the process chamber 8 to the process chamber 9 is under way (Step 306). If transporting of a sample from the process chamber 8 to the process chamber 9 is under way, the transporting time from the process chamber 8 to the process chamber 9 is counted (Step 308).

Further, it is judged whether or not transporting of a sample from the load lock chamber 6 to the process chamber 10 is under way (Step 310). If transporting of the sample from the load lock chamber 6 to the process chamber 10 is under way, the transporting time from the load lock chamber 6 to the process chamber 10 is counted (Step 312).

Further, it is judged whether or not transporting of a sample from the process chamber 10 to the process chamber 11 is under way (Step 314). If transporting of the sample from the process chamber 10 to the process chamber 11 is under way, the transporting time from the process chamber 10 to the process chamber 11 is counted (Step 316).

Next, it is judged whether or not transporting of the sample from the process chamber 9 to the unload lock chamber 12 is under way (Step 318). If transporting of the sample from the process chamber 9 to the unload lock chamber 12 is under way, the transporting time from the process chamber 9 to the unload lock chamber 12 is counted (Step 320).

Further, it is judged whether or not transporting of the sample from the process chamber 11 to the unload lock chamber 12 is under way (Step 322). If transporting of the sample from the process chamber 11 to the unload lock chamber 122 is under way, the transporting time from the process chamber 11 to the unload lock chamber 12 is counted (Step 324).

Next, it is judged whether or not processing of the sample is under way in the process chamber 8 (Step 326). If processing of the sample is under way in the process chamber 8, the sample processing time in the process chamber 8 is counted (Step 328).

Similarly, it is judged whether or not processing of the sample is under way in each of the process chambers 9 to 11 (Step 330 to Step 338). If processing of the sample is under way in a process chamber, the sample processing time in each of the process chambers is counted (Step 332 to Step 340).

The sample processing waiting time estimating means 400 and the sample processing order determining means 500 will be described. The waiting time period estimating processing for calculating a required time period to start processing in each of the process chambers 8 to 11 when a next sample is loaded in the process chamber, and transportation of each of the samples is started based on the calculated result.

For a sample processing under way now, the elapsed time period can be obtained by referring to time data of a program for measuring the processing time of the process chamber. Further, a calculation is executed by adding a time period Tout1, which is necessary for unloading the sample from the process chamber 8 after completing sample processing in the process chamber 8, a time period Tin1, which is necessary for loading a new sample in the process chamber 8 and a remaining time period Tn1 for processing the sample.

From the above, the time period T1 until completion of preparation to the start of processing of the new sample in the process chamber 8 can be obtained from the following equation.

$$T1 = Tn1 + Tout1 + Tin1$$

Similarly, the time period T2 for the process chamber 9 can be obtained from the following equation.

$$T2 = Tn2 + Tout2 + Tin2$$

Figure 4A:
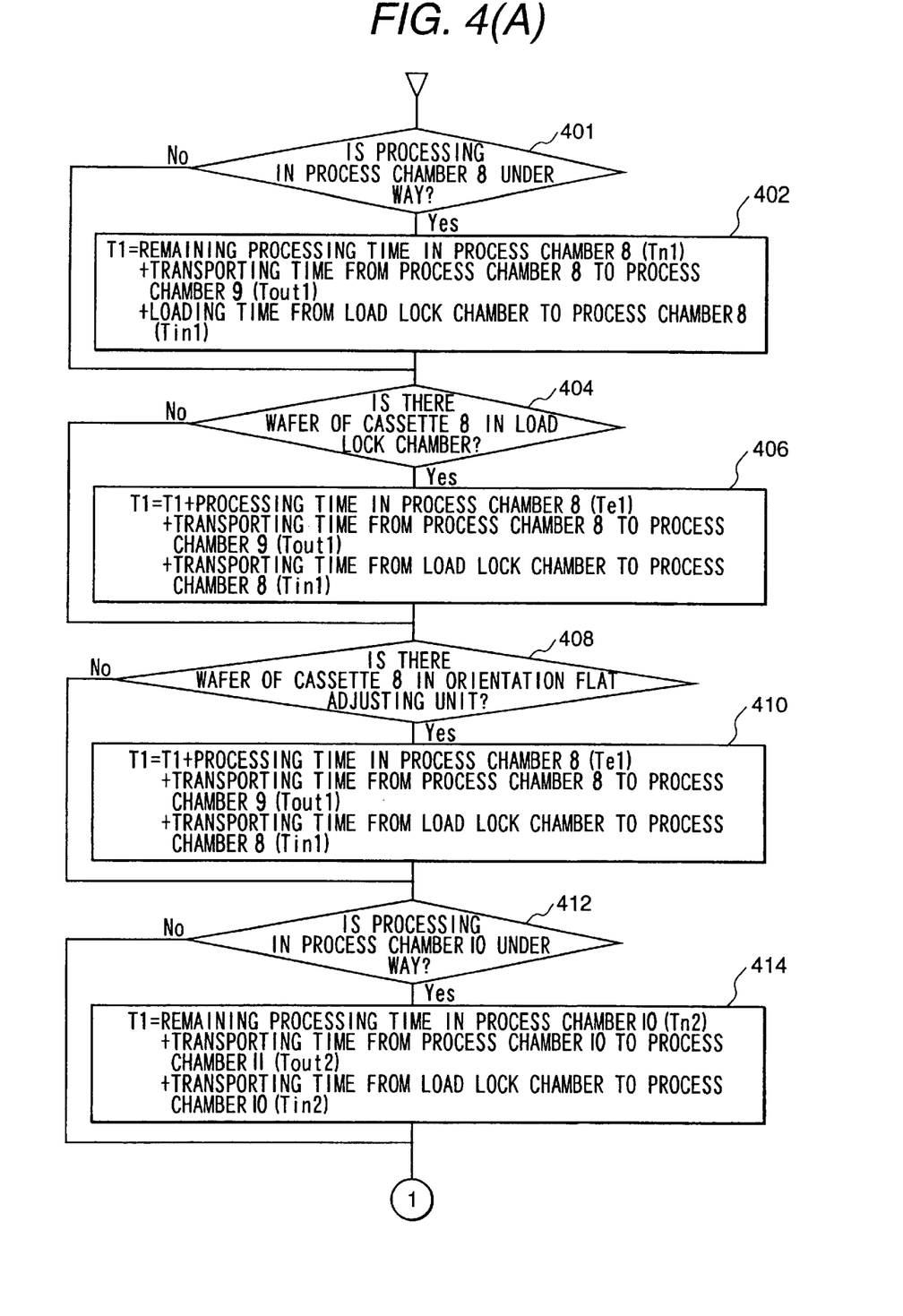
FIG. 4(A) and FIG. 4(B), when combined, provide a flowchart of waiting time estimation processing which calculates a required time period until starting of processing in each process chamber.
Figure 4B:
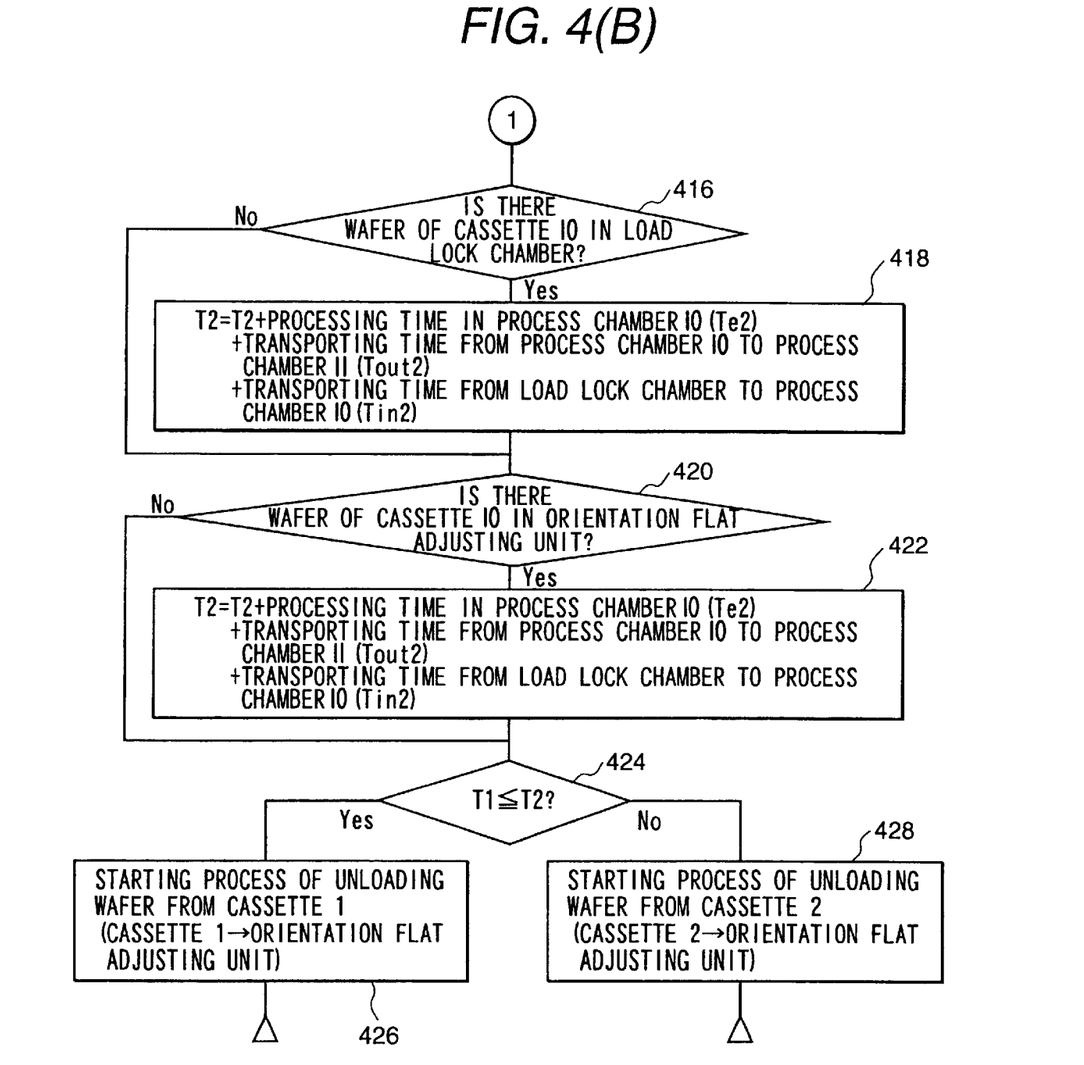
Figure 5A:
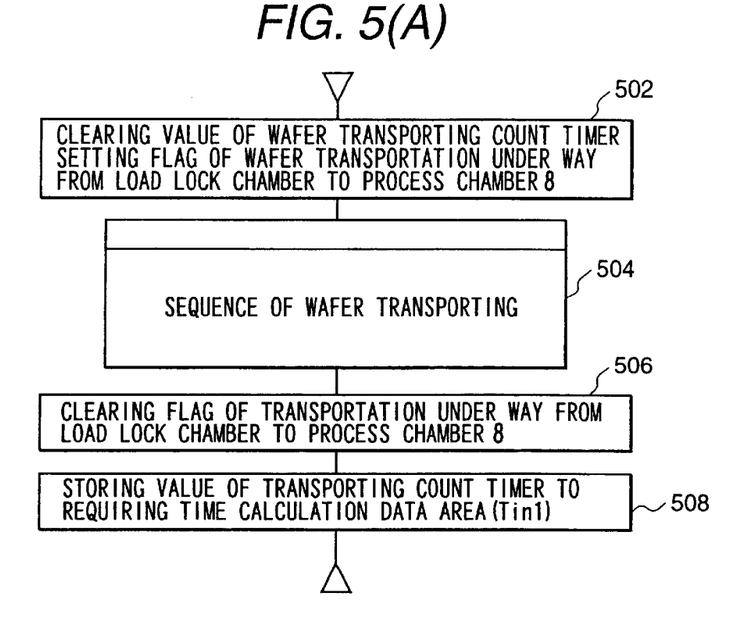
FIGS. 5(A) and 5(B) are flowcharts showing the sequences of transportation and processing of a sample, respectively.

FIGS. 4(A) and 4(B) constitute a flowchart of the waiting time estimation processing which calculates a required time period until starting of processing in each of the process chambers 8 to 11 described above. Referring to FIG. 4(A), it is judged whether or not processing in the process chamber 8 is under way (Step 401). In a case where the processing in the process chamber 8 is under way, assuming that the sample to be extracted next is in the sample cassette 1, a time period (T1) until processing of this sample ready for starting in the process chamber 8 is calculated from the following equation (Step 402).

T1=remaining processing time in the process chamber 8 (*Tn*1)+transporting time from the process chamber 8 to the process chamber 9 (*Tout*1)+loading time from the load lock chamber 6 to the process chamber 8 (*Tin*1)

Next, it is judged whether or not the sample of the sample cassette 1 is in the load lock chamber 6 (Step 404).

In a case where the sample of the sample cassette 1 is in the load lock chamber 6, assuming that the sample to be extracted next is in the sample cassette 1, a time period (T1) until processing of this sample ready for starting in the process chamber 8 is calculated from the following equation (Step 406).

T1=T1+processing time in the process chamber 8 (*Te*1)+transporting time from the process chamber 8 to the process chamber 9 (*Tout*1)+loading time from the load lock chamber 6 to the process chamber 8 (*Tin*1)

Next, it is judged whether or not the sample of the sample cassette 1 is in the orientation flat adjusting unit 5 (Step 408).

In a case where the sample of the sample cassette 1 is in the orientation flat adjusting unit 5, assuming that the sample to be extracted next is the sample cassette 1, a time period (T1) until processing of this sample ready for starting in the process chamber 8 is calculated from the following equation (Step 410).

T1=T1+processing time in the process chamber 8 (*Te*1)+transporting time from the process chamber 8 to the process chamber 9 (*Tout*1)+loading time from the load lock chamber 6 to the process chamber 8 (*Tin*1)

Further, it is judged whether or not processing in the process chamber 10 is under way (Step 4121).

In a case where the processing in the process chamber 10 is under way, assuming that the sample to be extracted next is in the sample cassette 2, a time period (T2) until processing of this sample ready for starting in the process chamber 10 is calculated from the following equation (Step 414).

T2=remaining processing time in the process chamber 10 (*Tn*2)+transporting time from the process chamber 10 to the process chamber 11 (*Tout*2)+loading time from the load lock chamber 6 to the process chamber 10 (*Tin*2)

Next, it is judged whether or not the sample of the sample cassette 2 is in the load lock chamber 6 (Step 416).

In a case where the sample of the sample cassette 2 is in the load lock chamber 6, assuming that the sample to be extracted next is in the sample cassette 2, a time period (T2) until processing of this sample ready for starting in the process chamber 10 is calculated from the following equation (Step 418).

T2=T2+processing time in the process chamber 10 (*Te*2)+transporting time from the process chamber 10 to the process chamber 11 (*Tout*2)+loading time from the load lock chamber 6 to the process chamber 10 (*Tin*2)

Next, it is judged whether or not the sample of the sample cassette 1 is in the orientation flat adjusting unit 5 (Step 420).

In a case where the sample of the sample cassette 1 is in the orientation flat adjusting unit 5, assuming that the sample to be extracted next is in the sample cassette 1, a time period (T2) until processing of this sample ready for starting in the process chamber 10 is calculated from the following equation (Step 422).

T2=T2+processing time in the process chamber 10 (*Te*2)+transporting time from the process chamber 10 to the process chamber 11 (*Tout*2)+loading time from the load lock chamber 6 to the process chamber 10 (*Tin*2)

In a case where a waiting time period for sample transportation occurs due to the construction of the apparatus, it is judged in taking sample transporting order protocol into consideration whether or not the waiting time period occurs. If the waiting time period occurs, the waiting time period can be obtained by calculating another transporting time period and another sample processing time period which in the cause of the waiting time period. By adding all the time periods obtained in taking these into consideration, the time period until completion of the preparation of performing the next sample processing in the process chamber can be calculated.

Next, the time period until starting to process the sample of the sample cassette 1 (T1) is compared with the time period until starting to process the sample of the sample cassette 2 (T2) (Step 424). If the time period until starting to process the sample of the sample cassette 1 (T1) is smaller, the sample is extracted from the sample cassette 1 to start transporting the sample to the orientation flat adjusting unit (Step 426). On the contrary, if the time period until starting to process the sample of the sample cassette 2 (T2) is smaller, the sample is started to be extracted from the sample cassette 2 (Step 428).

By comparing T1 and T2 obtained from calculation as described above, the sample is extracted from the sample cassette 1 to be transported to the load lock chamber when T1≦T2, and the sample is extracted from the sample cassette 2 to be transported to the load lock chamber when T1>T2.

In the above description of the embodiment, the order in which the samples are extracted is determined using time periods measured just before processes are executed, as they are. However, the order of extraction of the samples may be determined using averaged values of measured time periods obtained in the past.

In this case, the order of extraction of the samples can be determined similarly to the above-mentioned processing by replacing the loading, the transporting and the processing time periods described above with time periods obtained by processing to obtain average values using data accumulated in a required time calculation data area, as will be described later with reference to FIG. 5. The reason why the average values are used is that there are variations in the loading, the transporting and the processing time periods, and accordingly the sample processing efficiency per unit time of the overall vacuum process apparatus can be improved by using the average values.

Sequences of processing and transportation of the sample will be described with reference to FIG. 5(A), which shows a transporting sequence from the load lock chamber 6 to the process chamber 8. A sample transporting count timer value is cleared, and a flag of "transportation under way from the load lock chamber to the process chamber 1" is set (Step 502).

Next, the sequence of sample transportation is executed (Step 504). Next, the flag of "transportation under way from the load lock chamber to the process chamber 1" is cleared (Step 506). Further, the value of the transporting count timer is stored in the required time calculation data area (*Tin*1) (Step 508).

Figure 5B:
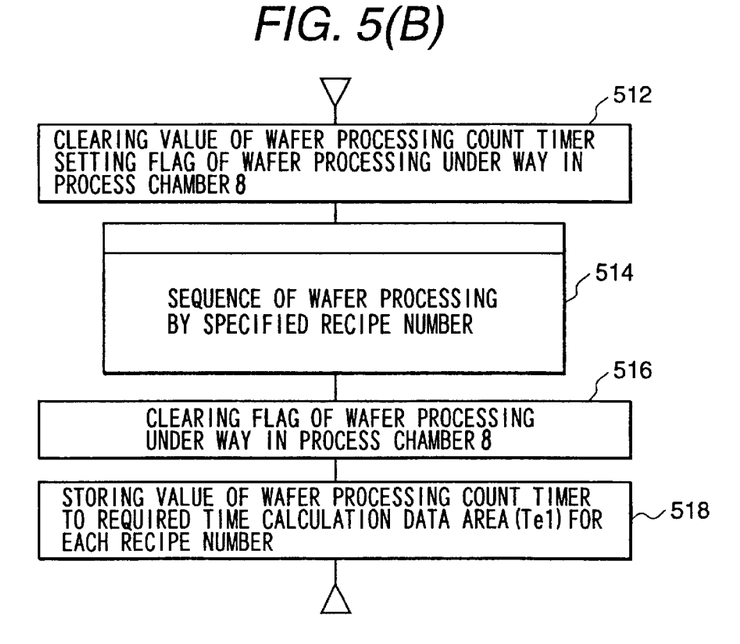

FIG. 5(B) shows a sample processing sequence in the process chamber 8. Initially, a sample transporting count timer value is cleared, and a flag of "sample processing under way in the process chamber 8" is set (Step 512). Next, the sequence of sample processing is executed (Step 514).

Next, the flag of "sample processing under way in the process chamber 8" is cleared (Step 516). Further, the value of the sample processing count timer is stored in the required time calculation data area (Te1) (Step 518).

The time periods required for loading and unloading samples are measured every time transporting processing is performed, and the time data is stored. By doing so, the time data can be stored by measuring the transporting process time periods from the beginning of a starting-up stage accompanied by installation of the vacuum process apparatus. Therefore, since the data is always accumulated at the start of the sample processing, the problem of lack of data never occurs.

Figure 6:
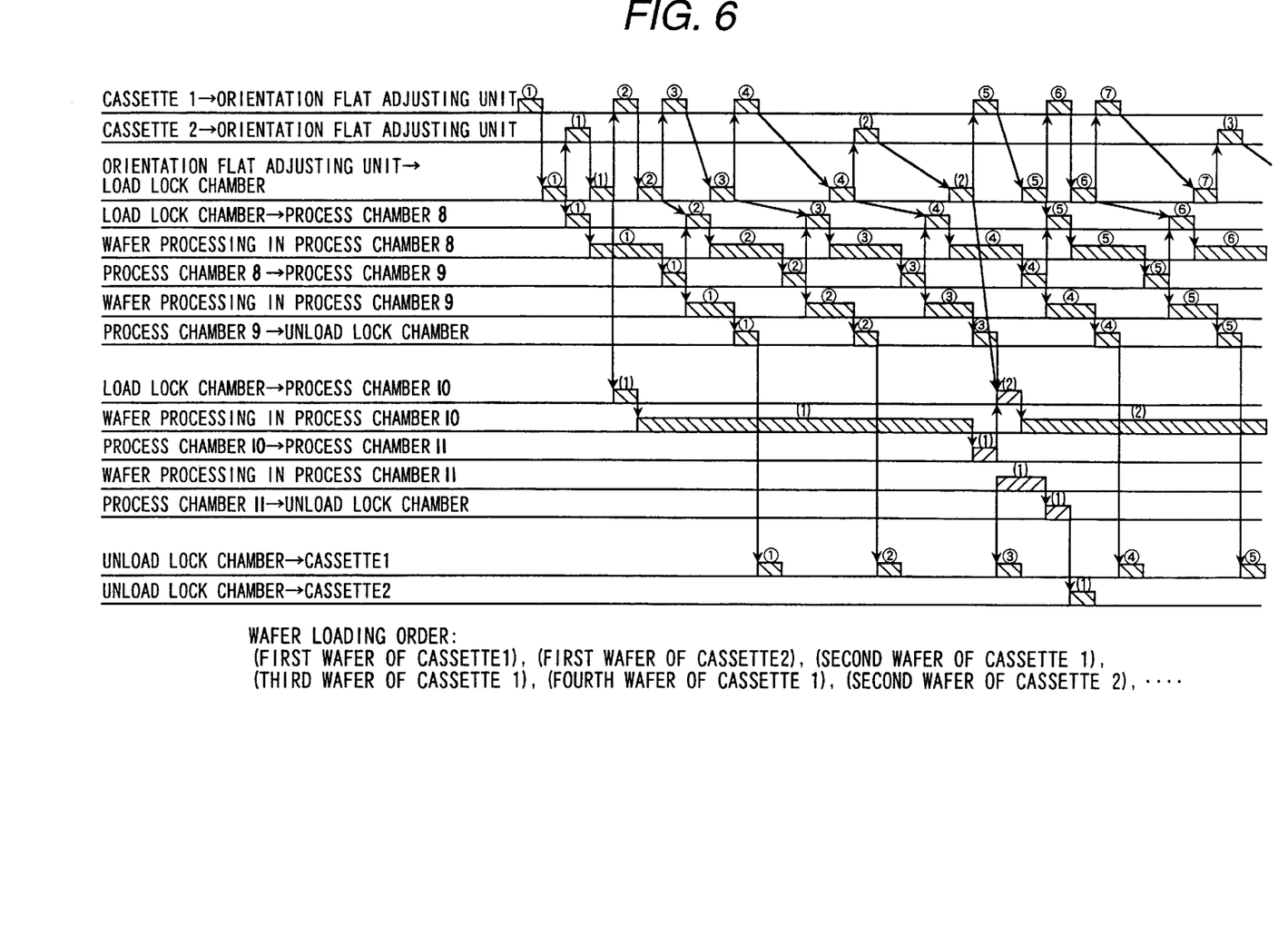
FIG. 6 is a chart showing timing of sample processing in a case of a sample loading procedure in accordance with the present invention.

The effects of the embodiment in accordance with the present invention will be described with reference to FIG. 6 and FIG. 7. Here, discussion will be made of a process in which the processing in the process chamber 10 among the four process chambers 8 to 11 takes a longer time than the processing in the other process chambers. FIG. 6 is a chart showing timing of the sample processing based on the order of sample loading in accordance with the present invention. When the samples are loaded from the two sample cassettes 1, 2 to the process chambers, useless waiting time periods hardly occur.

Figure 7:
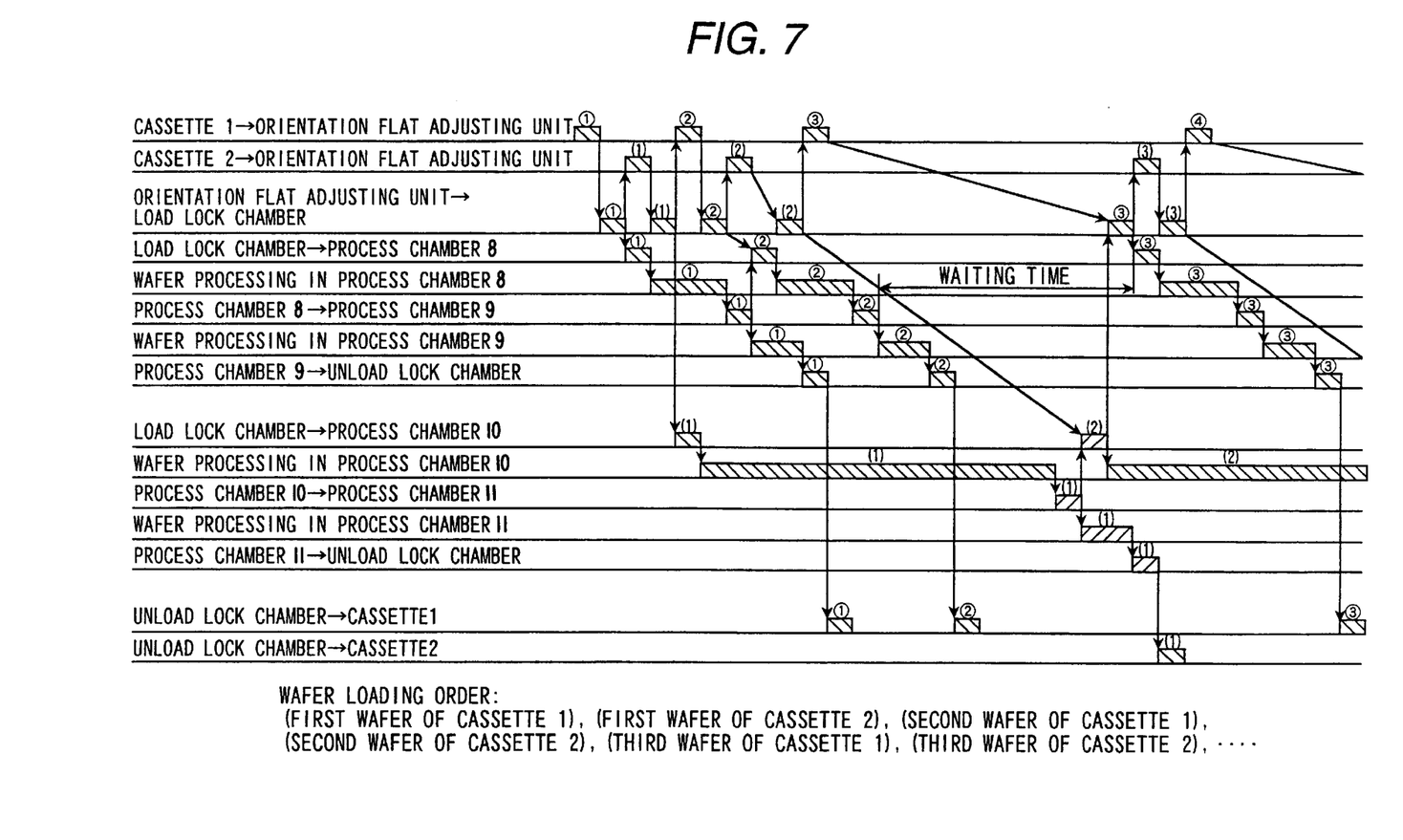
FIG. 7 is a chart showing timing of sample processing in a case of a sample loading procedure in the prior art.

On the other hand, FIG. 7 is a chart showing timing of sample processing based on the order of sample loading in a conventional method. Even if the samples are loaded to the process chambers so that numbers of samples extracted from the two sample cassettes 1, 2 become equal to each other, long waiting time periods occur in loading and unloading of the samples to and from the process chamber 10 because there are differences in the processing time periods between the process chamber 10 and the other process chambers.

It can be understood from the comparison between FIG. 6 and FIG. 7 that the vacuum process apparatus according to the present invention clearly has an effect to improve the sample processing efficiency, because a process chamber series which has a fast processing time can process a second sample and a third sample, while a process chamber series which has a slow processing time is processing a first sample.

What is claimed is:

1. A vacuum process apparatus comprising a plurality of cassettes for holding samples, transporting means for transporting said samples; a plurality of vacuum process chambers each for processing samples one by one; evacuation means for evacuating said vacuum process chambers; a load chamber and an unload chamber communicating with said vacuum process chambers and apparatus control means for controlling transporting and processing of said samples;

wherein said apparatus control means controls processing of said samples concurrently with plural recipes;

wherein said apparatus control means calculates a required time until completion of the preparation time to start processing of a newly loaded sample using a time period of sample loading to and a time period of sample unloading from each of said vacuum process chambers, and a processing time period of each of the samples, and loads a sample from a cassette, corresponding to a selected vacuum process chamber having the shortest required time among said vacuum process chambers, to said selected vacuum process chamber; and wherein said apparatus control means process in parallel on plural samples by setting a vacuum process chamber series of a one-to-one correspondence between each of said sample cassettes and each of said vacuum process chambers so that a sample is loaded to a vacuum process chamber by extracting said sample from a cassette corresponding to a vacuum process chamber series of having the shortest required time until completion of the preparation time to start the processing of a newly loaded sample in said vacuum process chamber.

2. A vacuum process apparatus comprising a plurality of cassettes for holding samples; transporting means for transporting said samples; a plurality of vacuum process chambers each for processing samples one by one; evacuation means for evacuating said vacuum process chambers; a load chamber and an unload chamber communicating with said vacuum process chambers; and apparatus control means for controlling transporting and processing of said samples;

wherein said apparatus control means controls processing of said samples concurrently with plural recipes; and wherein said apparatus control means performs a controlling operation by predicting a vacuum process chamber, of a plurality of vacuum process chambers, where a preparation for subsequently processing a newly loaded sample would be earliest completed among the plurality of vacuum process chambers and predicting a newly loading sample from the cassette corresponding one-to-one to the predicted vacuum process chamber.

3. A vacuum process apparatus according to claim 2 further comprising:

decision means for attaining through calculation a sample processing residual time, a processed sample unloading time, a waiting time for unloading the processed sample, a newly loaded sample loading time and a newly loaded sample loading waiting time for each of a plurality of vacuum process chambers, and for calculating a time period until a preparation for starting-up a newly loaded sample processing is completed for each of a plurality of vacuum process chambers; and sample transporting and processing control means for controlling an entire vacuum process apparatus so as to perform either processing or transporting of the sample in response to a result determined by said decision means for determining a sample loading order.

4. A vacuum process chamber according to any one of claims 1 and 3, wherein an order of extraction of said samples is determined using time periods measured just before a current processing is executed, as they are, as the time period of sample transporting, the time period of sample processing in the vacuum process chamber, the time period of sample loading, the time period of sample unloading, the time period of sample processing and the waiting time period.

5. A vacuum process chamber according to any one of claims 1 and 3, wherein an order of extraction of said samples is determined using averaged values of measured time periods obtained in the past as the time period of sample transporting, the time period of sample processing in the vacuum process chamber, the time period of sample loading, the time period of sample unloading, the time period of sample processing and the waiting time period.

6. A vacuum process apparatus according to claims 1 and 3, wherein said samples are individually unloaded and loaded from respective ones of said plurality of cassettes and individually transported throughout the vacuum process apparatus.

7. A method of operating a vacuum process apparatus including a plurality of cassettes for holding samples, transporting means for transporting said samples; a plurality of vacuum process chambers each for processing samples one by one; evacuation means for evacuating said vacuum process chambers; a load chamber and an unload chamber communicating with said vacuum process chambers and apparatus control means for controlling transporting and processing of said samples, the method comprising the steps of:

processing of said samples concurrently with plural recipes by the apparatus control means;

calculating a required time until completion of the preparation time to start processing of a newly loaded sample using a time period of sample loading to and a time period of sample unloading from each of said vacuum process chambers, and a processing time period of each of the samples, and loading a sample from a cassette, corresponding to a selected vacuum process chamber having the shortest required time among said vacuum process chambers, to said selected vacuum process chamber; and processing in parallel on plural samples by setting a vacuum process chamber series of a one-to-one correspondence between each of said sample cassettes and each of said vacuum process chambers so that a sample is loaded to a vacuum process chamber by extracting said sample from a cassette corresponding to a vacuum process chamber series of having the shortest required time until completion of the preparation time to start the processing of a newly loaded sample in said vacuum process chamber.

8. A method of operating a vacuum process chamber according to claim 7, wherein an order of extraction of said samples is determined using time periods measured just before a current process is executed, as they are, as the time period of sample transporting, the time period of sample processing in the vacuum process chamber, the time period of sample loading, the time period of sample unloading, the time period of sample processing and the waiting time period.

9. A method of operating a vacuum process chamber according to claim 7, wherein an order of extraction of said samples is determined using averaged values of time periods measured in the past as the time period of sample transporting, the time period of sample processing in the vacuum process chamber, the time period of sample loading, the time period of sample unloading, the time period of sample processing and the waiting time period.

10. A method of operating a vacuum process apparatus according to claim 7, wherein said samples are individually unloaded and loaded from respective ones of said plurality of cassettes and individually transported throughout the vacuum process apparatus.

* * * * *